United States Patent [19]
Seta

[11] Patent Number: 5,563,537
[45] Date of Patent: Oct. 8, 1996

[54] FREQUENCY-CONTROLLED CIRCUIT

[75] Inventor: Mitsuru Seta, Kawasaki, Japan

[73] Assignee: Fujitsu Limited, Kanagawa, Japan

[21] Appl. No.: 512,442

[22] Filed: Aug. 8, 1995

[30] Foreign Application Priority Data

Feb. 2, 1995 [JP] Japan .................... 7-015707

[51] Int. Cl.[6] .............................. H03J 7/02; H04L 27/14; H04L 27/22
[52] U.S. Cl. .......................... 327/113; 329/306; 329/323; 455/75; 327/44
[58] Field of Search .................. 327/44, 46, 47, 327/113; 329/300, 304, 306, 323; 455/75, 131, 134, 336–339

[56] References Cited

U.S. PATENT DOCUMENTS

| | | | |
|---|---|---|---|
| 3,320,537 | 7/1963 | Kuhns et al. | 325/335 |
| 3,543,239 | 7/1967 | Wallace, Jr. | 328/109 |
| 3,617,900 | 11/1971 | Fink | 324/82 |
| 3,805,171 | 4/1974 | Drumheller | 328/140 |
| 3,965,428 | 6/1976 | Katz et al. | 325/474 |
| 4,165,486 | 8/1979 | Yoshisato | 325/17 |
| 4,341,784 | 7/1982 | Matsumoto et al. | 424/256 |
| 4,382,937 | 5/1983 | Matsumoto et al. | 424/256 |
| 4,459,542 | 7/1984 | Terrier et al. | 324/77 |
| 4,571,396 | 2/1986 | Hutt et al. | 514/249 |
| 4,626,629 | 12/1986 | Premdi et al. | 379/386 |
| 4,705,789 | 11/1987 | Grohe et al. | 514/254 |
| 4,957,922 | 9/1990 | Lammens et al. | 514/255 |
| 4,962,108 | 10/1990 | Hutt, Jr. et al. | 514/249 |
| 4,988,709 | 1/1991 | Ogata et al. | 514/314 |
| 5,026,856 | 6/1991 | Yatsunami et al. | 546/156 |
| 5,164,402 | 11/1992 | Brighty | 514/300 |
| 5,214,693 | 5/1993 | Chujo | 379/386 |
| 5,291,081 | 3/1994 | Takeuchi et al. | 307/522 |

FOREIGN PATENT DOCUMENTS

| | | |
|---|---|---|
| 0200307 | 11/1986 | European Pat. Off. . |
| 0413455 | 2/1991 | European Pat. Off. . |
| 0516861 | 12/1992 | European Pat. Off. . |
| 0549857 | 7/1993 | European Pat. Off. . |
| 4120646 | 12/1992 | Germany . |
| 64-56673 | 3/1989 | Japan . |
| 4-139938 | 5/1992 | Japan . |
| 87-1958 | of 1987 | Rep. of Korea . |
| 89-2240 | of 1989 | Rep. of Korea . |

*Primary Examiner*—Timothy P. Callahan
*Assistant Examiner*—T. Lam

[57] ABSTRACT

A frequency-controlled circuit for automatically detecting a center frequency of a received signal whose frequency is shifted includes a frequency control unit for receiving the input signal and changing the frequency of the received signal into another frequency, a demodulating unit for demodulating a signal outputted from the frequency control unit, an incoming detecting unit for detecting whether a demodulated signal outputted from the demodulating unit is proper or improper and a level detecting unit for dividing a frequency band of the signal, obtained in the frequency control unit by adding a receive frequency band of the received signal to the center frequency of the received signal or subtracting the center frequency thereof from the receive frequency band thereof, into a plurality of narrower frequency bands and detecting respective power values of the divided frequency bands. A center-frequency determining unit detects the maximum value from the power values detected by the level detecting unit and outputs information about the divided frequency band having the detected maximum power value. A sweep/de-sweep control unit is provided, which allows the frequency control unit to sweep the received signal at a frequency bandwidth corresponding to the information about the divided frequency bands.

5 Claims, 10 Drawing Sheets

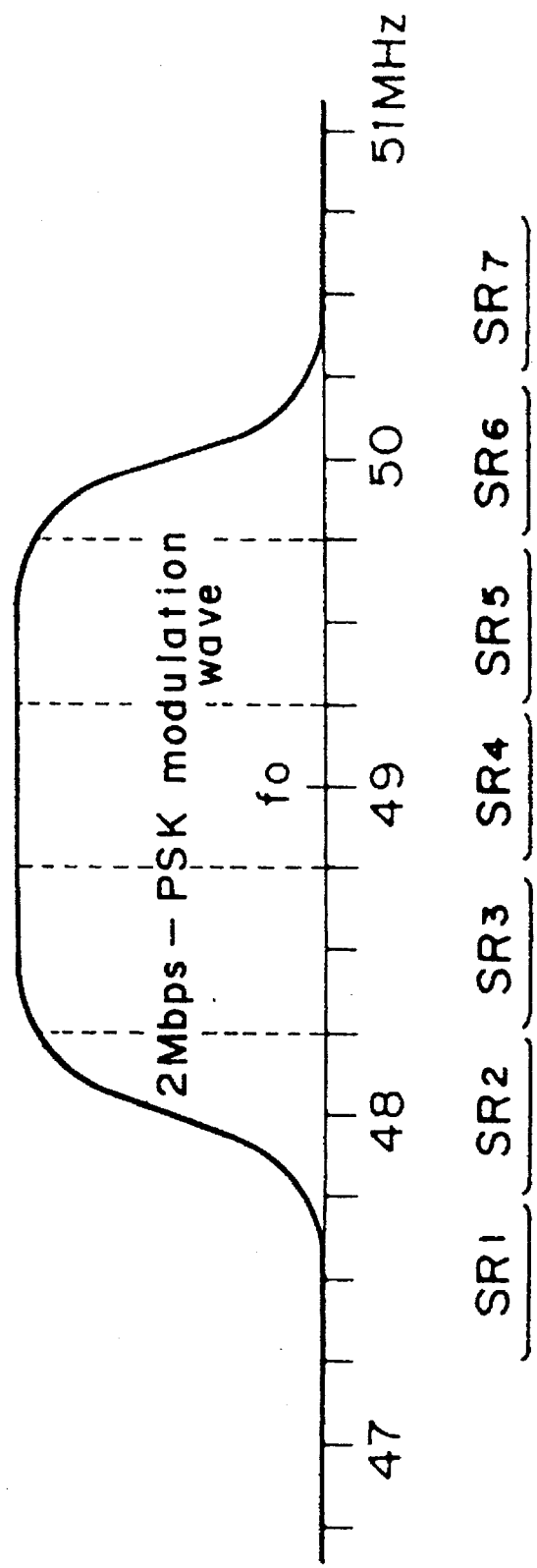

FREQUENCY-CONTROLLED CIRCUIT

BACKGROUND OF THE INVENTION

1. Field of the Invention

The present invention generally relates to a frequency-controlled circuit, and particularly to a frequency-controlled circuit based on a frequency sweep/de-sweep type automatic frequency control (AFC) system, for setting a frequency shift of a received signal, which is developed in a satellite communication device or a main body of a satellite, to a center frequency thereof by sweeping to thereby compensate for the frequency shift.

2. Description of the Related Art

A conventional frequency-controlled circuit based on a general frequency sweep/de-sweep type AFC system is constructed in such a manner that when it is desired to start to pull in or sweep a frequency (compensate for a frequency) firstly after power-up, for example, sweeping is started from a desired or fixed frequency. However, this type of system has a drawback that if a center frequency of a received signal is spaced away from a sweep start frequency or even if it is located close thereto, much time is spent on sweeping the center frequency when the received signal is swept in a direction opposite to a sweeping direction.

In order to avoid the above drawback, a frequency-controlled circuit of such a type as shown in FIG. 9 is known. The frequency-controlled circuit shown in FIG. 9 comprises a voltage-controlled oscillator (oscillator) 1, a mixer 2, a filter 3, an integrator 4, a gain value storage/selection circuit 5 and a demodulator 6.

The oscillator 1 outputs an oscillating signal whose frequency is varied according to a frequency control signal outputted from the gain value storage/selection circuit 5, to the mixer 2. The mixer 2 mixes the oscillating signal and a signal received thereat to thereby obtain a signal of another frequency. Further, the mixer 2 outputs the obtained signal to the demodulator 6 and then outputs it to the integrator 4 through the filter 3 for allowing only the changed frequency signal to pass therethrough. The demodulator 6 demodulates the signal outputted from the mixer 2 and outputs data obtained by the demodulation therefrom.

The integrator 4 integrates the output signal of the mixer 2, which has been transmitted through the filter 3, so as to calculate a gain value (power) thereof. Next, the integrator 4 outputs the gain value to the gain value storage/selection circuit 5. The gain value storage/selection circuit 5 stores the gain value therein and outputs a frequency control signal based on the stored gain value to the oscillator 1. The gain value storage/selection circuit 5 outputs a frequency control signal to the oscillator 1 in such a manner that N gain values of a frequency signal, which are obtained by N-dividing a frequency band of the received signal inputted to the mixer 2, are inputted. Further, the gain value storage/selection circuit 5 detects the maximum one from the N gain values obtained based on the outputted frequency control signal and outputs a frequency control signal to the oscillator 1 so that the AFC (automatic frequency control) is exercised only in the vicinity of the frequency having the maximum gain value.

According to this construction, a power distribution is first roughly measured over a sweeping frequency range of the received signal. Further, the AFC is exercised on the frequency at which the maximum power is detected. It is therefore possible to sweep the center frequency in a short time.

In the conventional aforementioned frequency-controlled circuit shown in FIG. 9, when the received signal is of a PSK (Phase Shift Keying) modulation wave as represented by a frequency spectral map shown in FIG. 10, for example, the neighborhood of a center frequency $f_0$ (=49 MHz) of the received signal is flat over a wide frequency range (PSK and roll-off filter are often used and the neighborhood of the center frequency becomes flat in this case) and the distribution of power is constant. Therefore, when a frequency band of the received signal is N-divided into frequency slots $SR_1$ through $SR_7$ every 500 KHz, for example, and the maximum gain value is determined at each slot of $SR_1$ through $SR_7$, a plurality of slots $SR_3$, $SR_4$ and $SR_5$ each having the maximum gain value exist. Therefore, a problem arises that an area at which the center frequency $f_0$ exists, cannot be accurately detected.

SUMMARY OF THE INVENTION

It is therefore an object of the present invention to provide a frequency-controlled circuit capable of automatically detecting a center frequency of a received signal whose frequency is shifted, in a short time.

In accordance with an aspect of the present invention, there is provided a frequency-controlled circuit for automatically detecting a center frequency of a received signal by sweeping, comprising: frequency control means for converting a frequency of the received signal into another including a first voltage-controlled oscillator and a first mixer coupled to said oscillator and receiving a received signal for mixing a frequency of the received signal and an oscillation frequency of a signal produced by the first voltage-controlled oscillator; demodulating means for demodulating a signal outputted from the frequency control means; incoming detecting means for detecting whether a demodulated signal outputted from the demodulating means is proper or improper; level detecting means for dividing a frequency band of said receive signal into thereto obtained by adding a receive frequency band of the received signal to the center frequency of the received signal or subtracting the center frequency thereof from the receive frequency band thereof, into a plurality of frequency bands and detecting respective power values of the divided frequency bands; center-frequency determining means coupled to said level detecting means for detecting the maximum one from the power values detected by and outputted from the level detecting means and outputting information about the divided frequency band having the detected maximum power value, the center-frequency determining means outputting information about central divided frequency bands when an odd number of divided frequency bands each having the maximum power value continuously exist, outputting information about a divided frequency band on the sweeping start side as seen in a sweeping direction of the received signal when an even number of divided frequency bands each having the maximum power value continuously exist, the divided frequency band being selected from two central divided frequency bands, and outputting information about a desired divided frequency band selected from the continuous divided frequency bands each having the maximum power value when the same maximum power values are detected within spaced-away divided frequency bands, in a manner similar to the case where the odd number of divided frequency bands and the even number of divided frequency bands exist; and sweep/de-sweep control means for outputting a first frequency control signal to perform control for sweeping the received signal at a frequency bandwidth corresponding to the information about the desired divided frequency band, to the first voltage-controlled oscillator when the incoming detecting means detects that the demodulated signal is improper and outputting a second frequency control signal to perform control for fixing the oscillation frequency generated from the first voltage-controlled oscillator when the incoming detecting means detects that the demodulated signal is proper.

The level detecting means comprises, for example, a second voltage-controlled oscillator, a second mixer for combining the frequency of the received signal and an oscillation frequency generated from the second voltage-controlled oscillator into another frequency, a filter for allowing a signal having only a predetermined band outputted from the second mixer to pass therethrough, a power detecting unit for detecting a power value of the signal transmitted through the filter and outputting it to the center-frequency determining means and a sweep instructing unit for controlling the oscillation frequency of the voltage-controlled oscillator so that the signal having the divided frequency band is outputted from the second mixer.

The frequency control means comprises, for example, a third mixer connected to the input of the first voltage-controlled oscillator and an oscillator for supplying an oscillating signal for allowing the second mixer to convert the frequency of the received signal into another to the third mixer. In this case, the level detecting means comprises a plurality of filters connected to the output of the third mixer and a plurality of power detecting units for detecting power values of the signals transmitted through the plurality of filters and outputting the detected power values to the center-frequency determining means.

The above and other objects, features and advantages of the present invention and the manner of realizing them will become more apparent, and the invention itself will best be understood from a study of the following description and appended claims with reference to the attached drawings showing some preferred embodiments of the invention.

BRIEF DESCRIPTION OF THE DRAWINGS

The invention will hereinafter be described with reference to the accompanying drawings wherein:

FIG. 10 is a frequency spectral map illustrating a PSK modulation wave.

DETAILED DESCRIPTION OF THE PREFERRED EMBODIMENTS

Figure 1:
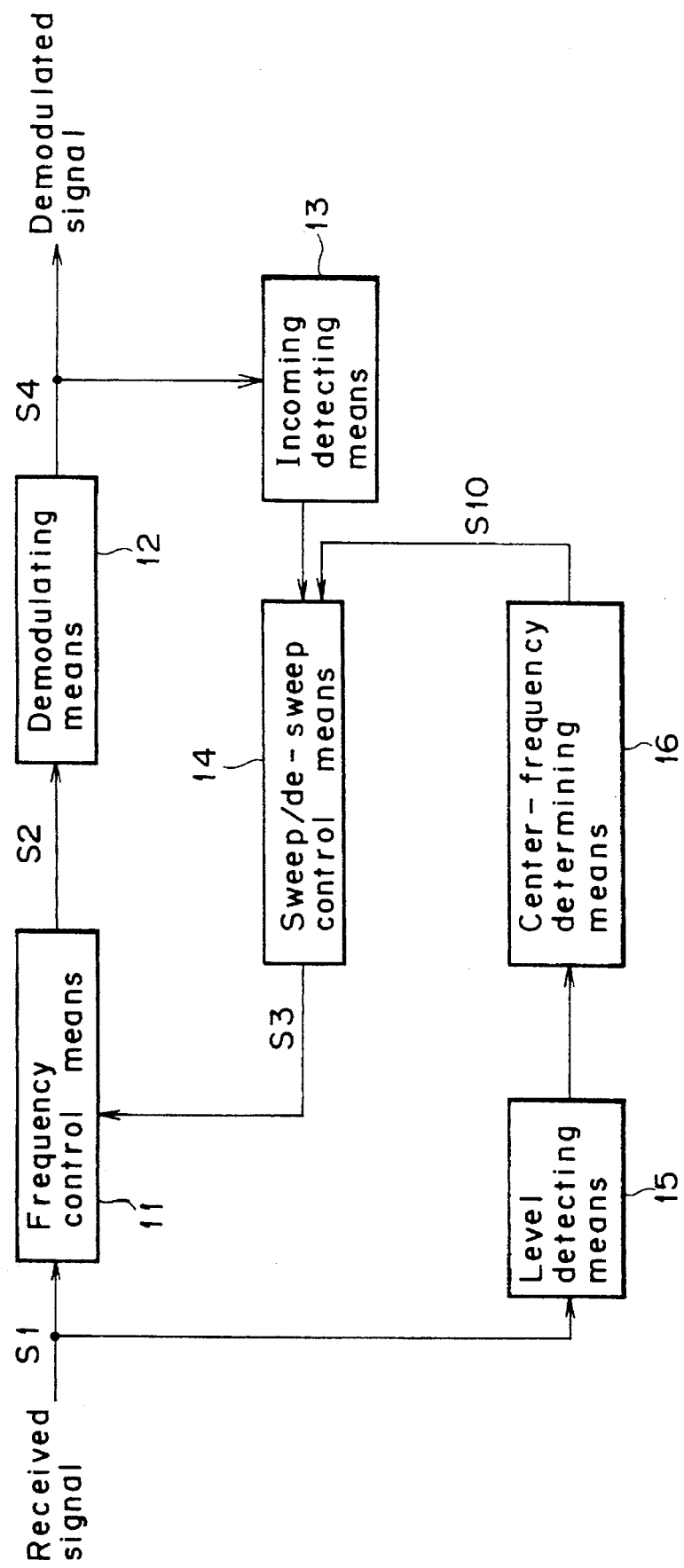
FIG. 1 is a block diagram showing the principle of the present invention.

The principle of a frequency-controlled circuit of the present invention will be firstly described with reference to FIG. 1. The frequency-controlled circuit automatically detects a center frequency of a received signal S1 by sweeping. In the drawing, reference numeral 11 indicates a frequency control means which combines a frequency of the received signal S1 and an oscillation frequency of a first voltage-controlled oscillator varied in response to a control signal S3 by a first mixer into other frequency.

Reference numeral 12 indicates a demodulating means which demodulates a signal S2 outputted from the frequency control means 11. Reference numeral 13 indicates an incoming detecting means which detects whether a demodulated signal S4 outputted from the demodulating means 12 is proper or improper. Reference numeral 15 indicates a level detecting means which obtains a frequency band by adding a frequency band of the received signal S1 to the center frequency of the received signal S1 or subtracting the center frequency from the receive frequency band divides the obtained frequency band into a plurality of frequency bands and detects individual power values of the divided frequency bands.

Reference numeral 16 indicates a center-frequency determining means which detects the maximum value from the individual power values detected by the level detecting means 15 and outputs information about a divided frequency band having the detected maximum power value. When an odd number of divided frequency bands each having the maximum power value continuously exist, the center-frequency determining means 16 outputs information about central divided frequency bands therefrom. On the other hand, when an even number of divided frequency bands continuously exist, the center-frequency determining means 16 outputs information about a divided frequency band on a sweeping start side as seen in a sweeping direction of the received signal S1, which is selected from two central divided frequency bands. When the same maximum power values are detected within spaced-away divided frequency bands, the center-frequency determining means 16 outputs information about a desired divided frequency band from the continuous divided frequency bands each having the maximum power value.

Reference numeral 14 indicates a sweep/de-sweep control means. When the incoming detecting means 13 detects that the demodulated signal S4 is improper, the sweep/de-sweep control means 14 outputs a control signal S3 to the frequency control means for controlling the frequency control means 11 to allow the frequency control means 11 to sweep the received signal S1 at a frequency bandwidth corresponding to the information about the divided frequency band, to the frequency of the first voltage-controlled oscillator of the frequency control means 11. On the other hand, when the incoming detecting means 13 detects that the demodulated signal S4 is proper, the sweep/de-sweep control means 14 outputs a control signal S3 for controlling the frequency control means 11 to fix the oscillation frequency of the first voltage-controlled oscillator, to the frequency control means 11.

According to the present invention described above, the level detecting means 15 divides a frequency band that has taken displacements or shifts in the width of the received signal S1 into consideration, into a plurality of narrow bands and detects individual power values of the divided frequency bands. A narrow band including the center frequency of the received signal S1 is detected from the result of detection of the divided frequency band having the maximum one of the individual power values by the center-frequency determining means 16. On the other hand, when the incoming detecting means 13 detects that the demodulated signal S4 is improper, i.e., when the received signal S1 is not introduced or pulled in properly, the sweep/de-sweep control means 14 controls the frequency control means 11 based on the control signal S3 in such a manner that the received signal S1 is swept by the frequency control means 11 at a frequency bandwidth corresponding to information about a divided frequency band outputted from the center-frequency determining means 16, i.e., a narrow frequency bandwidth.

Since the sweeping of the received signal S1 is performed only at the narrow band under the control referred to above, the time required to sweep the received signal S1 is shortened. When the center frequency of the received signal S1 is detected by this sweeping, it is judged that the demodulated signal S4 is proper. Therefore, the incoming detecting means 13 detects that the demodulated signal S4 is proper or normal. Namely, since the received signal S1 is in a state of being properly introduced or pulled-in, the sweep/de-sweep control means 14 causes the frequency control means 11 to stop the sweeping of the received signal S1 in response to the control signal S3 outputted therefrom in order to hold such a state and controls the frequency control means 11 to fix the oscillation frequency of the first voltage-controlled oscillator of the frequency control means 11.

Figure 2:
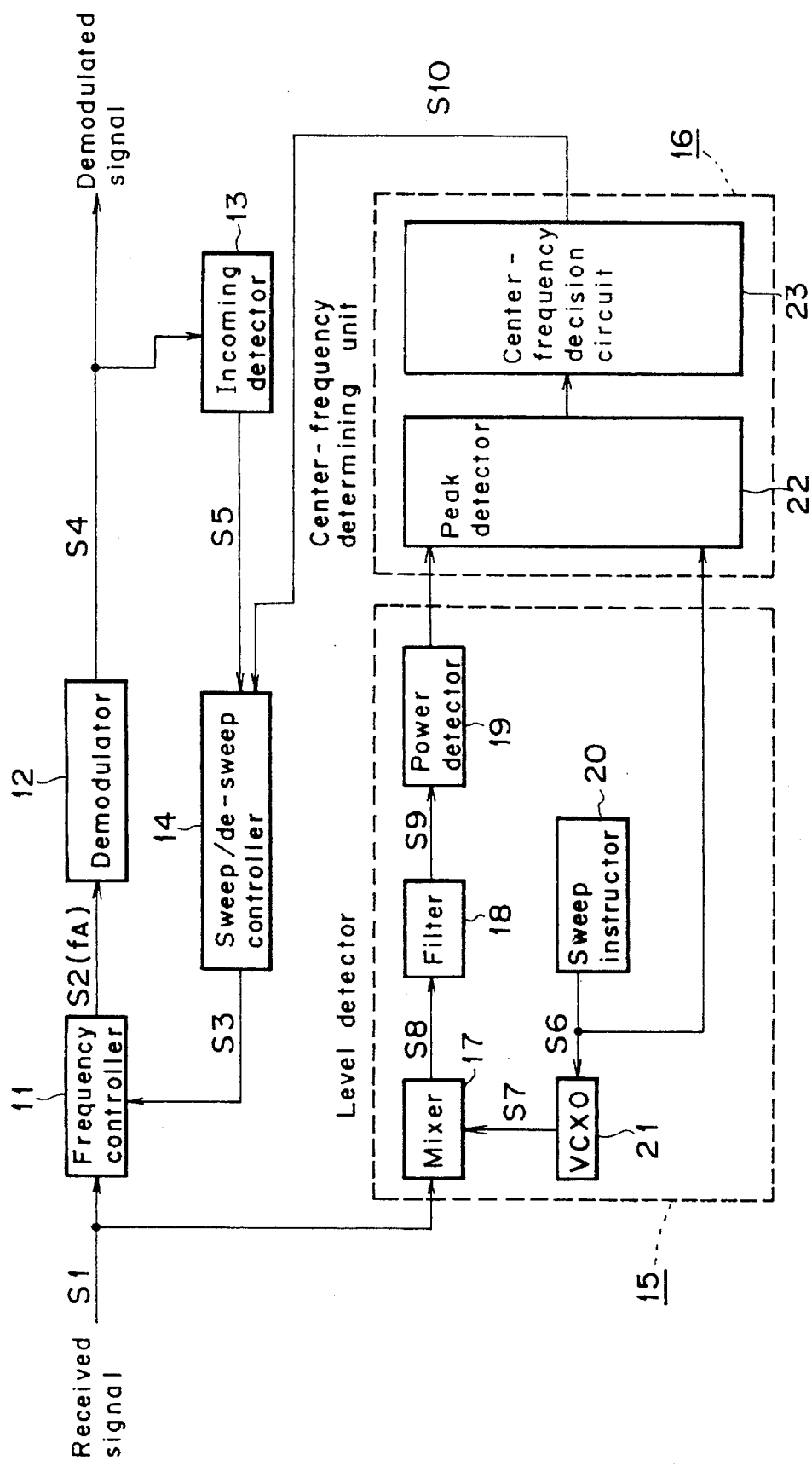
FIG. 2 is a block configurational view illustrating a frequency-controlled circuit according to a first embodiment of the present invention.

Preferred embodiments of the present invention will hereinafter be described with reference to the accompanying drawings. FIG. 2 is a block configurational view showing a frequency-controlled circuit according to a first embodiment of the present invention. In FIG. 2, reference numerals 11, 12, 13, 14, 15 and 16 respectively indicate a frequency controller, a demodulator, an incoming detector, a sweep/de-sweep controller, a level detector and a center-frequency determining unit. The level detector 15 comprises a mixer 17, a filter 18, a power detector 19, a sweep instructor 20 and a VCXO (Voltage-controlled crystal oscillator) 21. The center-frequency determining unit 16 comprises a peak detector 22 and a center-frequency decision circuit 23.

The frequency controller 11 converts a frequency $f_R \pm \Delta f$ (where $f_R$: original receive center frequency and $\Delta f$: frequency shift or deviation) of a signal (received signal) S1 sent from an unillustrated transmitter into a predetermined frequency $f_A$. Further, the frequency controller 11 comprises a mixer and a VCXO (not shown in FIG. 2) unillustrated in the drawing. The received signal S1 is frequency-converted into other signal by supplying a control signal S3 outputted from the sweep/de-sweep controller 14 to the VCXO and mixing a signal outputted from the VCXO whose frequency is varied in response to the control signal S3 and the received signal S1 together by the mixer.

The demodulator 12 demodulates the signal S2 converted by the frequency controller 11 and outputs a demodulated signal S4 to a data processor (not shown) and then to the incoming detector 13. The incoming detector 13 detects a synchronizing signal included in the demodulated signal S4 and outputs a pull-in status signal S5 indicative of the fact that the pulling-in or introduction of a frequency to be received upon its detection is properly made, to the sweep/de-sweep controller 14.

The level detector 15 divides a frequency band $f_R \pm (\Delta f_{max} + B/2)$ in which the maximum deviated or shifted width $\pm \Delta f_{max}$ of the center frequency $f_R$ of the received signal S1 and a bandwidth (assumed to be equal to B) of a signal to be received have been taken into consideration, into a plurality of frequency bands (frequency slots) $SR_1$ through $SR_n$ and detects individual power values of the divided frequency slots $SR_1$ through $SR_n$.

Figure 3:
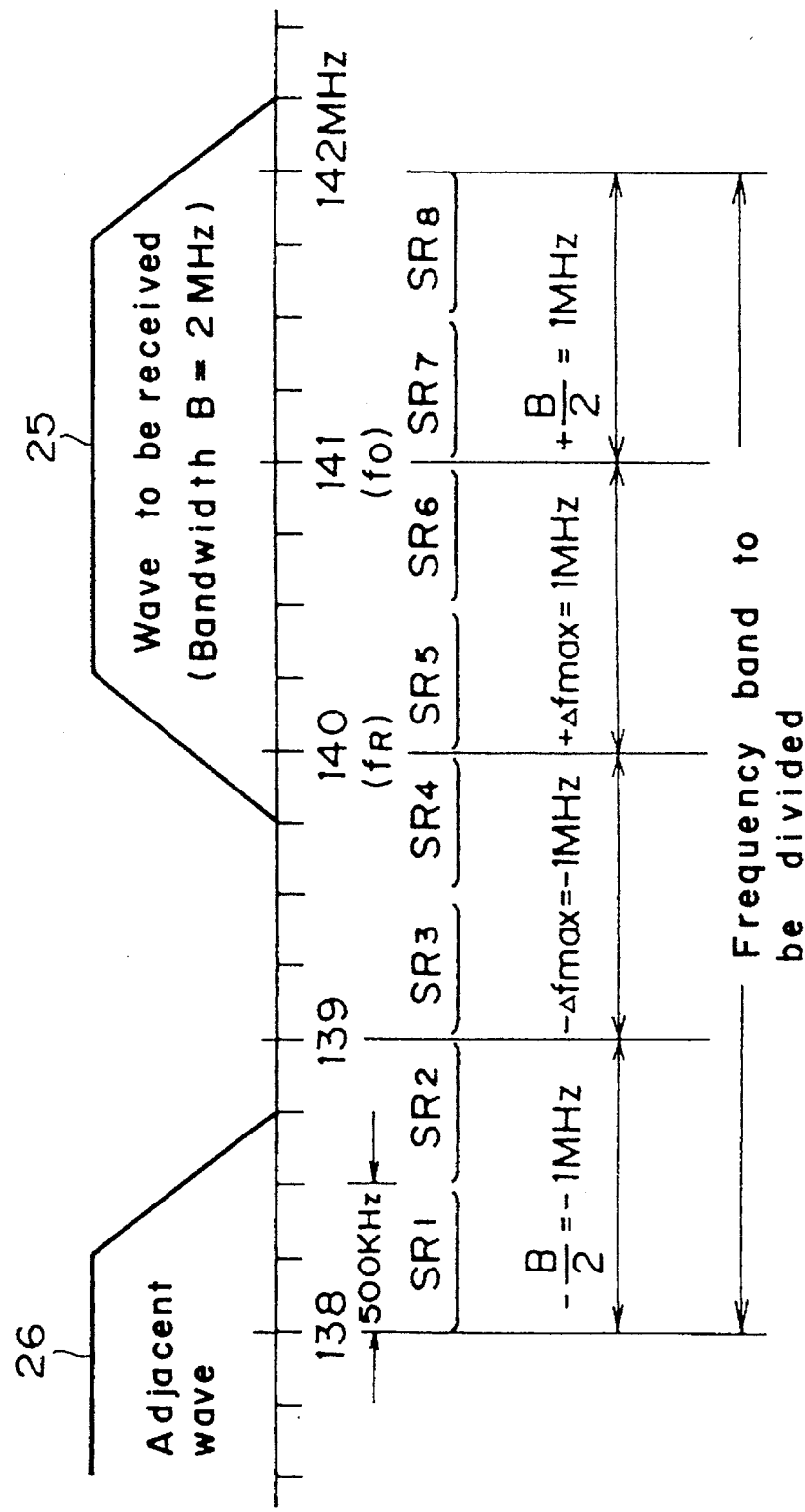
FIG. 3 is a spectral map showing frequency bands of a received signal and frequency slots thereof.

Here, the maximum shifted width $\pm \Delta f_{max}$ is equivalent to the total of maximum values of deviations or shifts having the possibility of being produced in a satellite communication device or a main body of a satellite. If a frequency bandwidth B of a signal S1 desired to receive, which has a maximum shifted width $\pm \Delta f_{max}$ equal to $\pm 1$ MHz, is 2 MHz and the center frequency $f_R$ thereof is 140 MHz as shown in FIG. 3 by way of example, then the frequency band to be divided ranges from 138 MHz to 142 MHz. In FIG. 3, the frequency band designated at numeral 25 shows a case where the center frequency $f_R$ of the signal S1 to be received is shifted to $f_0$ (i.e., when the center frequency is shifted to maximum on the positive (+) side).

The sweep instructor 20 of the level detector 15 divides the frequency band $f_R \pm (\Delta f_{max} + B/2)$ into a plurality of slots, i.e., eight slots $SR_1$ through $SR_8$ as shown in FIG. 3 in the present embodiment and provides instructions for successively sweeping the respective slots. The instructions are given based on a sweep instruction signal S6. In order to detect a power value of the slot $SR_1$ indicative of a bandwidth ranging from 138 MHz to 138.5 MHz, the sweep instructor 20 outputs a sweep instruction signal S6 for controlling a signal S7 outputted from the VCXO 21 to the mixer 17 to 138.25 MHz. When the signal S7 of 138.25 MHz is outputted from the VCXO 21 according to this control, the signal S7 is mixed into the received signal S1 in the mixer 17 so that a frequency band associated with the slot $SR_1$ is outputted to the filter 18 as a signal S8 whose frequency band ranges from 0 MHz to 0.25 MHz.

The filter 18 allows only the bandwidth signal whose frequency band ranges from 0 MHz to 0.25 MHz to pass therethrough. When the above signal S8 is inputted to the filter 18, the filter 18 allows the signal S8 to pass therethrough and outputs the signal S8 to the power detector 19. The power detector 19 detects the level or strength of power (power value) of a signal S9 that has passed through the filter 18. When the signal S9 associated with the slot $SR_1$ is inputted to the power detector 19, the power detector 19 detects the power value of the slot $SR_1$, i.e., the power value of the slot $SR_1$ indicative of the bandwidth of the received signal S1, which ranges from 138 MHz to 138.5 MHz.

Similarly, when it is desired to detect a power value of the slot $SR_2$ indicative of a bandwidth ranging from 138.5 MHz to 139 MHz, the sweep instructor 20 outputs a sweep instruction signal S6 for controlling the output signal S7 of the VCXO 21 to 138.75 MHz. Thus, a frequency band corresponding to the slot $SR_2$ passes through the filter 18 as a signal whose frequency bandwidth ranges from 0 MHz to 0.25 MHz and is then inputted, as a signal S9, to the power detector 19 where the power value of the slot $SR_2$, i.e., the power value indicative of the bandwidth of the received signal S1, which ranges from 138.5 MHz to 139 MHz, is detected. Similarly, instructions for detecting power values of the slot $SR_3$ through $SR_8$ are hereafter given by the sweep instructor 20 so that the power values indicative of bandwidths of the received signal S1, which are associated with the slots $SR_3$ through $SR_8$, are detected.

The center-frequency determining unit 16 detects the maximum value of the power values of the slots $SR_1$ through $SR_8$, which have been detected by the power detector 19, and outputs slot information about the detected maximum power value to the sweep/de-sweep controller 14. Namely, the peak detector 22 of the center-frequency determining unit 16 detects, based on the sweep instruction signal S6 inputted thereto upon outputting the power value from the power detector 19, to which one of the slots $SR_1$ through $SR_8$ the power value outputted therefrom corresponds, and temporarily stores therein the power values every slots $SR_1$ through $SR_8$. Further, the peak detector 22 detects a slot having the maximum value of the stored power values and outputs it to the center-frequency decision circuit 23.

If the number of slots each having the maximum power value and outputted from the peak detector 22 is judged as single, then the center-frequency decision circuit 23 outputs slot information S10 about the maximum power value to the sweep/de-sweep controller 14. However, when the number of the slots each having the maximum power value is plural, the center-frequency decision circuit 23 outputs information S10 about the central slot of the plurality of slots. If the number of the slots each having the maximum power value is now considered as odd, then the center-frequency decision circuit 23 outputs the information S10 about the central slot. On the other hand, when the number of the slots is considered as even, the center-frequency decision circuit 23 outputs slot information S10 on the sweeping start side as seen in a sweeping direction of the received signal S1 by the sweep/de-sweep controller 14, which is selected from two central slot information.

When a wave adjacent to a radio wave 25 to be received enters into a frequency band $f_R \pm (\Delta f_{max} + B/2)$ for performing slot separation as designated at numeral 26 in FIG. 3, there is a possibility of the same maximum power values being detected from slots fully spaced away from one another. In such a case, however, the center-frequency decision circuit 23 selects a desired slot as described above from a slot group in which the slots each having the maximum power value are continuously arranged, and outputs information S10 about the selected slot to the sweep/de-sweep controller 14.

If a pull-in status signal S5 outputted from the incoming detector 13 indicates that the pulling in of a frequency to be received is not performed properly, then the sweep/de-sweep controller 14 outputs a control signal S3 for sweeping a frequency band corresponding to the slot information S10 outputted from the center-frequency decision circuit 23, to the frequency controller 11. If the slot information S10 is considered to be information about the slot $SR_6$ shown in FIG. 3, for example, then the sweep/de-sweep controller 14 outputs a control signal S3 for allowing the frequency controller 11 to sweep a band of the received signal S1, which ranges from 140.5 MHz to 141 MHz, in a frequency increasing direction.

If each of signals S2 successively outputted from the frequency controller 11 in response to the sweeping control signal S3 is demodulated by the demodulator 12 and a synchronizing signal included in the demodulated signal S4 is detected by the incoming detector 13, then the pull-in status signal S5 will result in the representation of the proper pulling-in of the frequency to be received. In this case, the sweep/de-sweep controller 14 controls the frequency controller 11 based on the control signal S3 outputted therefrom so that it stops sweeping and pulls in the frequency of the received signal S1 at the present time. Namely, since the center frequency $f_0$ is 141 MHz in the received signal 25 shown in FIG. 3, the sweep/de-sweep controller 14 controls the frequency controller 11 so that it stops sweeping when the received signal S1 of 141 MHz is pulled in by sweeping and pulls in the center frequency $f_0$ of 141 MHz.

According to the frequency-controlled circuit of the first embodiment mentioned above, the frequency slot in which the center frequency $f_0$ of the received signal S1 whose frequency is shifted, exists, can be accurately detected from the plurality of frequency slots $SR_1$ through $SR_n$ obtained by dividing the frequency band in which the maximum shifted width of the received signal S1 and the bandwidth of the signal to be received have been taken into consideration. Further, the center frequency $f_0$ can be detected by sweeping the received signal S1 only at the band of the detected frequency slot. It is therefore possible to pull in a desired frequency in a short time.

Figure 4:
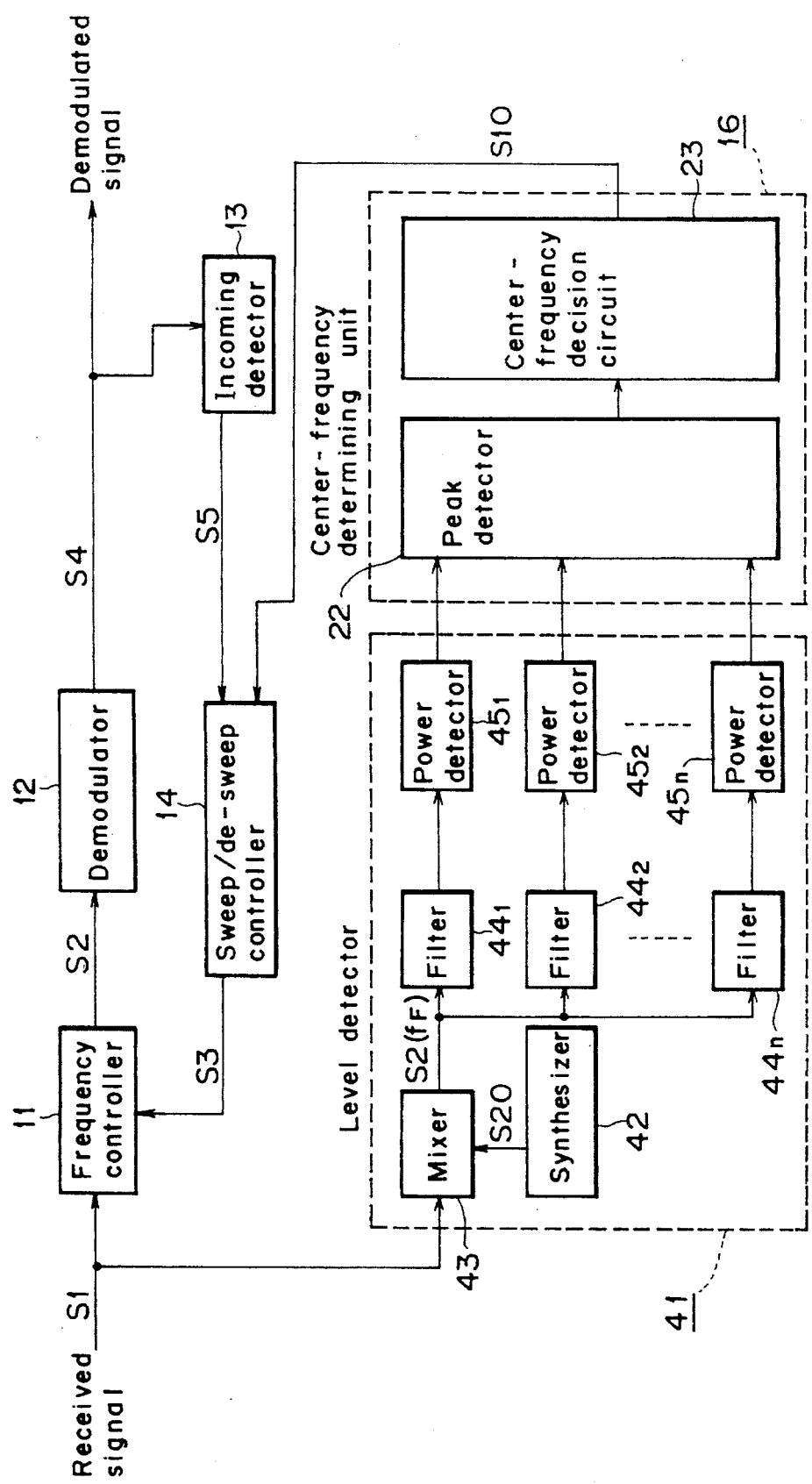
FIG. 4 is a block configurational view depicting a frequency-controlled circuit according to a second embodiment of the present invention.

A second embodiment will next be described with reference to FIG. 4. In the second embodiment shown in FIG. 4, however, components associated with those employed in the first embodiment shown in FIG. 2 are identified by like reference numerals and their description will therefore be omitted. The second embodiment shown in FIG. 4 differs from the first embodiment shown in FIG. 2 in that the configuration of the level detector 15 shown in FIG. 2 is changed to that of a level detector 41 shown in FIG. 4. In other words, the level detector 41 comprises a synthesizer 42, a mixer 43, N filters $44_1$ through $44_n$ and N power detectors $45_1$ through $45_n$.

The synthesizer 42 outputs an oscillating signal S20 for converting a frequency of a received signal S1 into another frequency by the mixer 43. When the center frequency $f_R$ of the received signal S1 is of, for example, 140 MHz in a manner similar to the first embodiment and the center frequency thereof is converted into 48 MHz, which is in turn outputted from the mixer 43, a signal S20 of 92 MHz is outputted from the synthesizer 42. Thus, a signal S21 whose center frequency $f_F$ is 48 MHz, is outputted from the mixer 43.

Figure 5:
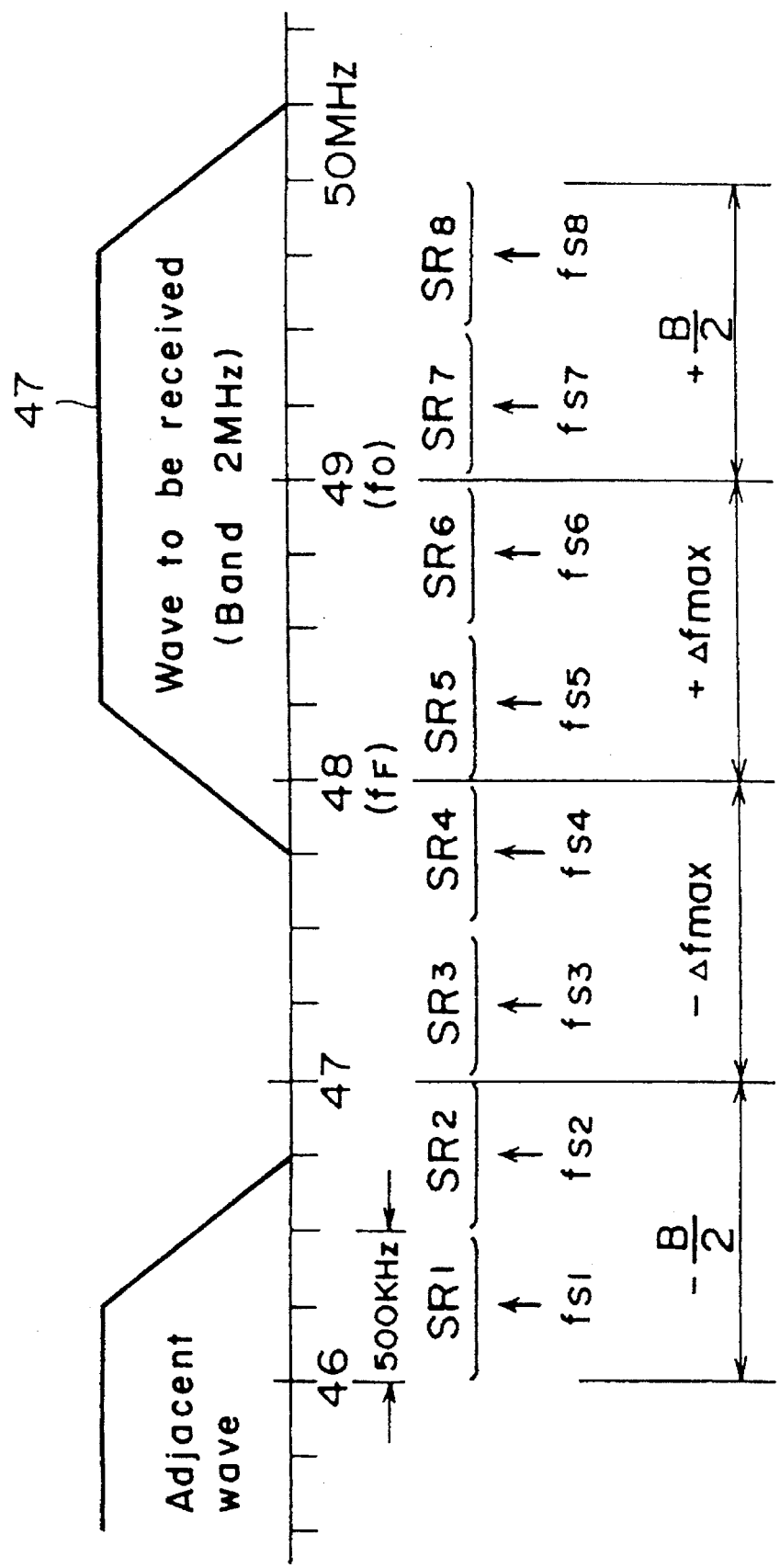
FIG. 5 is a spectral map showing frequency bands of a received signal and frequency slots thereof at the time that the received signal has been frequency-converted.

The filters $44_1$ through $44_n$ respectively have passbands different from one another and allow the signal S21 outputted from the mixer 43 to pass therethrough. In the present embodiment, the number of filters $44_1$ through $44_n$ is eight. A frequency band $f_F \pm (\Delta f_{max} + B/2)$ ranging from 46 MHz to 50 MHz as shown in FIG. 5, which is obtained by converting, with the mixer 43, the frequency band $f_R \pm (\Delta f_{max} + B/2)$ in which the maximum shifted width $\pm \Delta f_{max}$ of the center frequency $f_R$ of the received signal S1 and the bandwidth B of the signal to be received both described in the first embodiment, is divided into eight frequency slots $SR_1$ through $SR_8$ (whose individual passband widths are 500 KHz) corresponding to the eight filters $44_1$ through $44_8$. Further, the filters $44_1$ through 448 cause frequency bands of the divided frequency slots $SR_1$ through $SR_8$ to pass therethrough respectively. In FIG. 5, however, a frequency band designated at numeral 47 shows a case where the center frequency $f_F$ of a signal to be originally received is shifted to $f_0$.

Namely, the first filter $44_1$ allows a signal whose frequency range is from 46 MHz to 46.5 MHz corresponding to the frequency band of the slot $SR_1$ of the signal S21 outputted from the mixer 43, to pass therethrough. The second filter $44_2$ causes a signal whose frequency range is from 46.5 MHz to 47 MHz corresponding to the frequency band of the slot $SR_2$ to pass therethrough. The third through seventh filters $44_3$ through $44_7$ are activated in the same manner as described above. The remaining eighth filter $44_8$ allows a signal whose frequency range is from 49.5 MHz to 50 MHz corresponding to the frequency band of the slot $SR_8$ to pass therethrough.

The power detectors $45_1$ through $45_n$ are identical in number to the filters $44_1$ through $44_n$. Further, the power detectors $45_1$ through $45_n$ respectively detect power values of signals transmitted through the filters $44_1$ through $44_n$. Since the eight filters $44_1$ through $44_8$ are used in the present embodiment, the eight power detectors $45_1$ through $45_8$ are used in the same manner. Namely, the first power detector $45_1$ detects the power value of the signal transmitted through the first filter $44_1$ and whose frequency range is from 46 MHz to 46.5 MHz. The second power detector $45_2$ detects the power value of the signal transmitted through the second filter $44_2$ and whose frequency range is from 46.5 MHz to 47 MHz. The third to seventh power detectors $45_3$ through $45_7$ are activated in the same manner as described above. The remaining eighth power detector $45_8$ detects the power value of the signal transmitted through the eighth filter $44_8$ and whose frequency range is from 49.5 MHz to 50 MHz.

A peak detector 22 detects the maximum one of the detected power values of the individual slots $SR_1$ through $SR_8$ in the same manner as described in the first embodiment. The second embodiment described above can also bring about the same advantageous effect as that obtained in the first embodiment.

Figure 6:
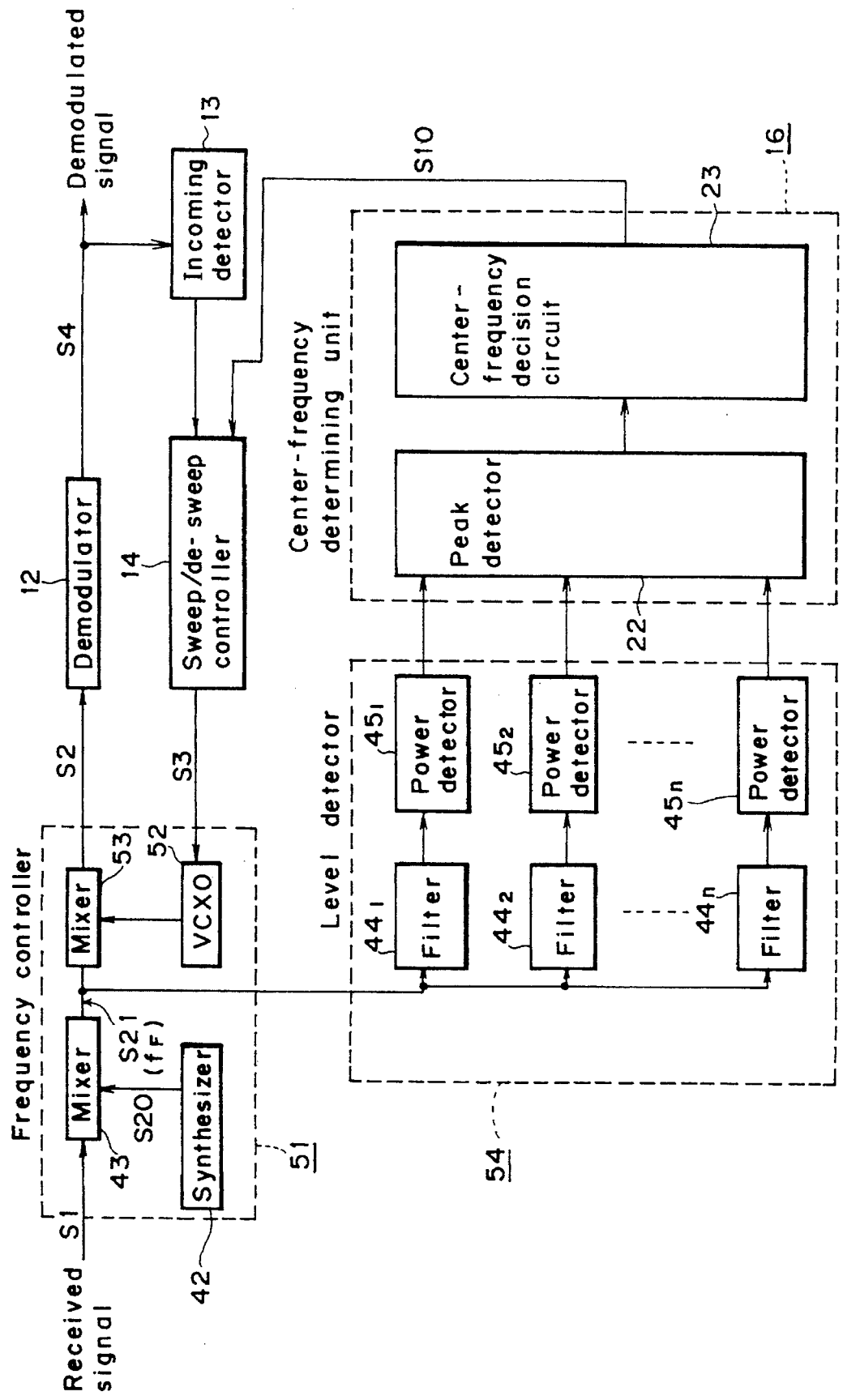
FIG. 6 is a block configurational view showing a frequency-controlled circuit according to a third embodiment of the present invention.

A third embodiment will now be described with reference to FIG. 6. In the third embodiment shown in FIG. 6, however, components corresponding to those employed in the second embodiment shown in FIG. 4 are identified by like reference numerals and their description will therefore be omitted. The third embodiment shown in FIG. 6 differs from the second embodiment shown in FIG. 4 in that the synthesizer 42 and the mixer 43 both employed in the level detector 41 shown in FIG. 4 are shifted to a frequency controller 51 as shown in FIG. 6 and the output of a mixer 43 is electrically connected to the input of a mixer 53 originally set up to the frequency controller 51 although this arrangement is not shown in FIG. 4. Further, a VCXO designated at numeral 52 in the frequency controller 51 is also originally included in the frequency controller 51 and supplies an oscillating signal to the mixer 53 in response to a control signal S3.

Thus, a level detector 54 shown in FIG. 6 comprises filters $44_1$ through $44_n$ respectively connected to the output of the mixer 43 of the frequency controller 51, and power detectors $45_1$ through $45_n$. Even in the case of such a configuration of the third embodiment, the mixer 43 of the frequency controller 51 converts a frequency of a received signal S1 into another frequency in the same manner as described in the second embodiment and outputs the converted frequency to each of the filters $44_1$ through $44_n$. Therefore, the third embodiment can bring about the same advantageous effect as that obtained in the second embodiment.

Figure 7:
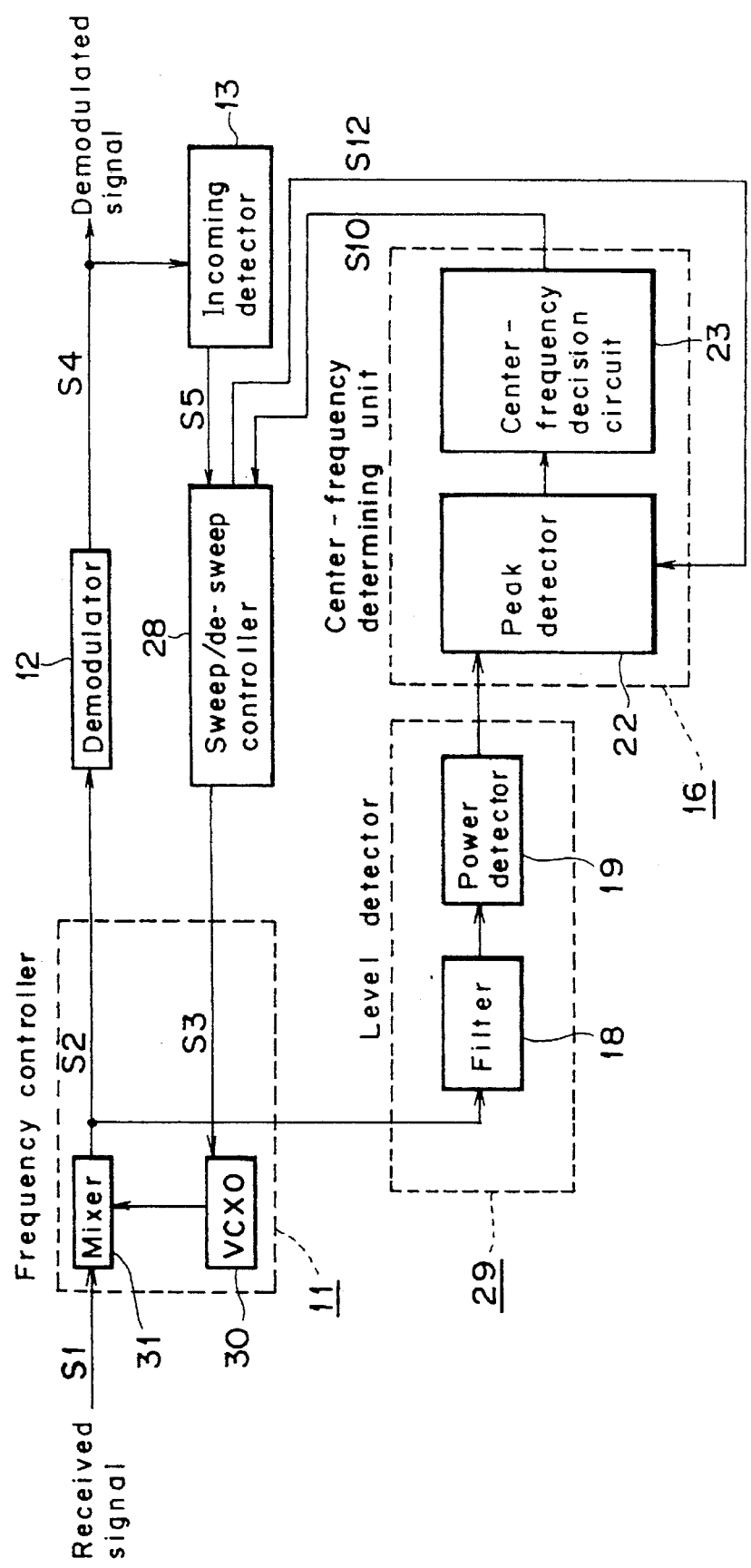
FIG. 7 is a block configurational view illustrating a frequency-controlled circuit according to a fourth embodiment of the present invention.

A fourth embodiment will now be described with reference to FIG. 7. In the fourth embodiment shown in FIG. 7, however, components associated with those employed in the first embodiment shown in FIG. 2 are identified by like reference numerals and their description will therefore be omitted. The fourth embodiment shown in FIG. 7 is different from the first embodiment shown in FIG. 2 in that a sweep/de-sweep controller 28 shown in FIG. 7 has the function of the sweep instructor 20 shown in FIG. 2 and a VCXO 30 and a mixer 31 of a frequency controller 11 shown in FIG. 7 share the VCXO 21 and the mixer 17 shown in FIG. 2.

Namely, a level detector 29 comprises a filter 18 for allowing only frequency components ranging from 0 MHz to 0.25 MHz, of a signal S2 outputted from the mixer 31 to pass therethrough, and a power detector 19. Further, the sweep/de-sweep controller 28 includes the function of the sweep/de-sweep controller 14 shown in FIG. 2, which has been described in the first embodiment, and the function of dividing a frequency band $f_R \pm (\Delta f_{max} + B/2)$ in which the maximum shifted width $\pm \Delta f_{max}$ of a center frequency $f_R$ of a received signal S1 and a bandwidth B of the received signal S1 have been taken into consideration, into a plurality of frequency slots corresponding to the slots $SR_1$ through $SR_8$ shown in FIG. 3 in the present embodiment, providing instructions for successively sweeping the respective slots based on a control signal S3 and outputting a signal S12 indicative of which slot would be specified at present according to the above instructions, to a peak detector 22.

According to such a construction, the sweep/de-sweep controller 28 first outputs the control signal S3 for controlling an oscillating signal outputted from the VCXO 30 to the mixer 31 to 138.25 MHz in order to detect the power value of the slot $SR_1$ indicative of the bandwidth ranging from 138 MHz to 138.5 MHz shown in FIG. 3. When the VCXO 30 outputs a signal of 138.25 MHz correspondingly, the mixer 31 mixes the signal outputted therefrom and the received signal S1. If the received signal S1 falls within a frequency band corresponding to the slot $SR_1$, then the mixed signal is outputted to the power detector 19 through the filter 18 as a signal S2 whose frequency range is from 0 MHz to 0.25 MHz.

The power detector 19 detects a power value of a signal transmitted through the filter 18, i.e., the power value of the slot $SR_1$ of the received signal S1. The detected power value is inputted to the peak detector 22 where it is judged based on the signal S12 indicative of the slot, which is outputted to the peak detector 22, to which slot the power value corresponds. Thus, the power value associated with the slot $SR_1$ is temporarily stored in the peak detector 22.

Similarly, the sweep/de-sweep controller 28 provides instructions for detecting individual power values of the slots $SR_2$ through $SR_8$. As a result, the power values indicative of bandwidths of the received signal S1, which correspond to the slots $SR_2$ through $SR_8$, are detected and temporarily stored in the peak detector 22. When the power values of all the slots $SR_1$ through $SR_8$ are stored in the peak detector 22, the peak detector 22 detects the maximum value from the power values and outputs it to a center-frequency decision circuit 23. The center-frequency decision circuit 23 outputs slot information S10 about the maximum power value outputted from the peak detector 22, to the sweep/de-sweep controller 28 in the same manner as described in the first embodiment.

If a pull-in status signal S5 outputted from an incoming detector 13 indicates that a frequency to be received is not pulled in properly, then the sweep/de-sweep controller 28 outputs a control signal S3 for sweeping a frequency band of the received signal S1 in response to the slot information S10 outputted from the center-frequency decision circuit 23, to a frequency controller 11. If the slot information S10 is assumed to be the information about the slot $SR_6$ shown in FIG. 3, for example, then the sweep/de-sweep controller 28 outputs a control signal S3 for allowing the frequency controller 11 to sweep a band of the received signal S1, which ranges from 140.5 MHz to 141 MHz in a frequency increasing direction.

If each of signals S2 successively outputted from the frequency controller 11 in response to the sweeping control signal S3 is demodulated by a demodulator 12 and a synchronizing signal included in the demodulated signal S4 is detected by the incoming detector 13, then the pull-in status signal S5 will result in the representation of the proper pulling-in of the frequency to be received. In this case, the sweep/de-sweep controller 28 controls the frequency controller 11 based on the control signal S3 outputted therefrom so that it stops sweeping and pulls in the frequency of the received signal S1 at the present time.

Namely, since the center frequency $f_0$ is 141 MHz in the received signal 25 shown in FIG. 3, the sweep/de-sweep controller 28 controls the frequency controller 11 so that it stops sweeping when the received signal S1 of 141 MHz is pulled in by sweeping and pulls in the center frequency $f_0$ of 141 MHz. The fourth embodiment described above can exhibit the same advantageous effect as that obtained in the first embodiment. Further, since the VCXO and mixer in the frequency controller 11 share the VCXO and mixer used for the separation of the frequency slots, the frequency-controlled circuit can be reduced in size correspondingly.

Figure 8:
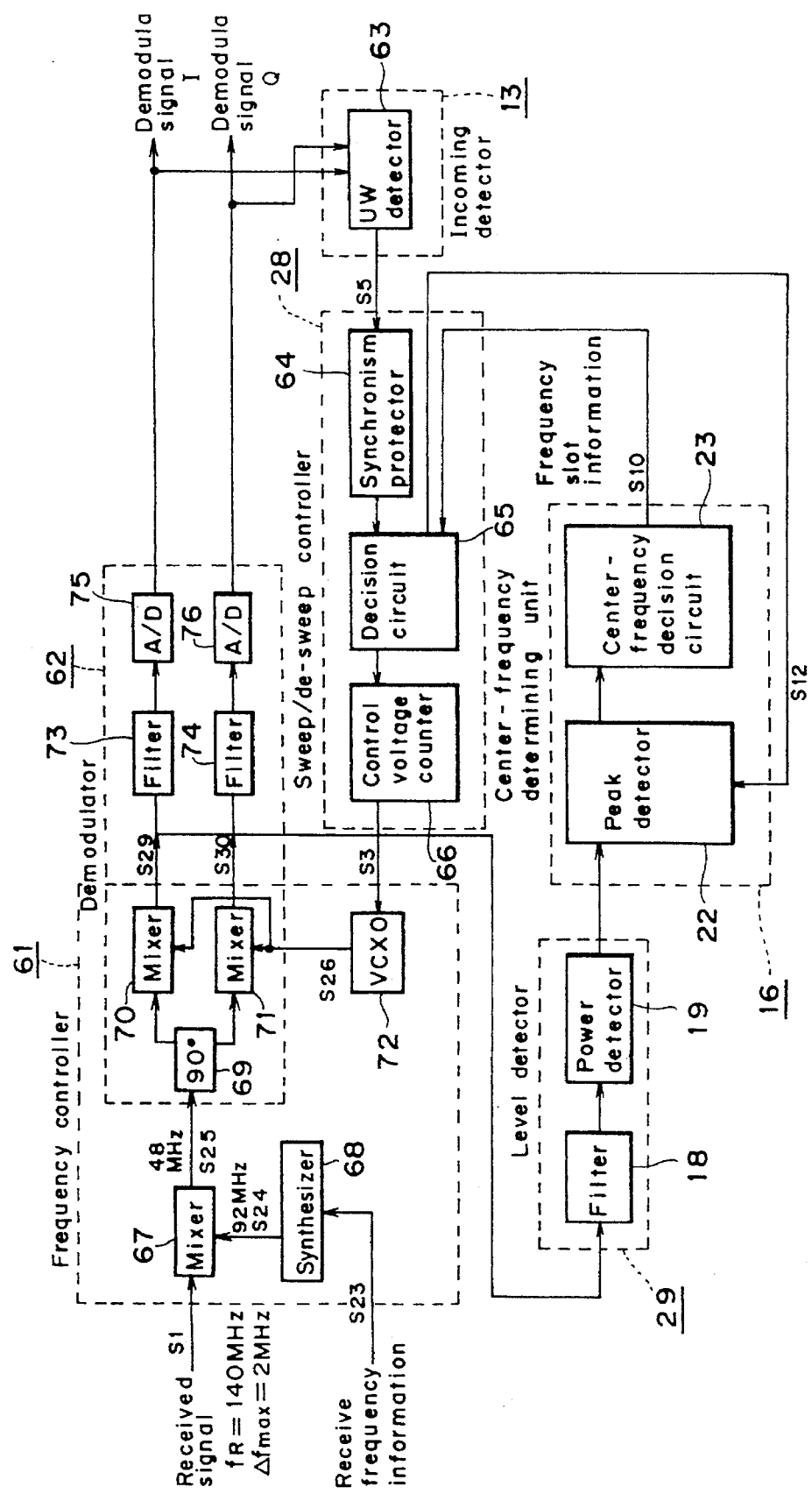
FIG. 8 is a block configurational view depicting a frequency-controlled circuit according to a fifth embodiment of the present invention.
Figure 9:
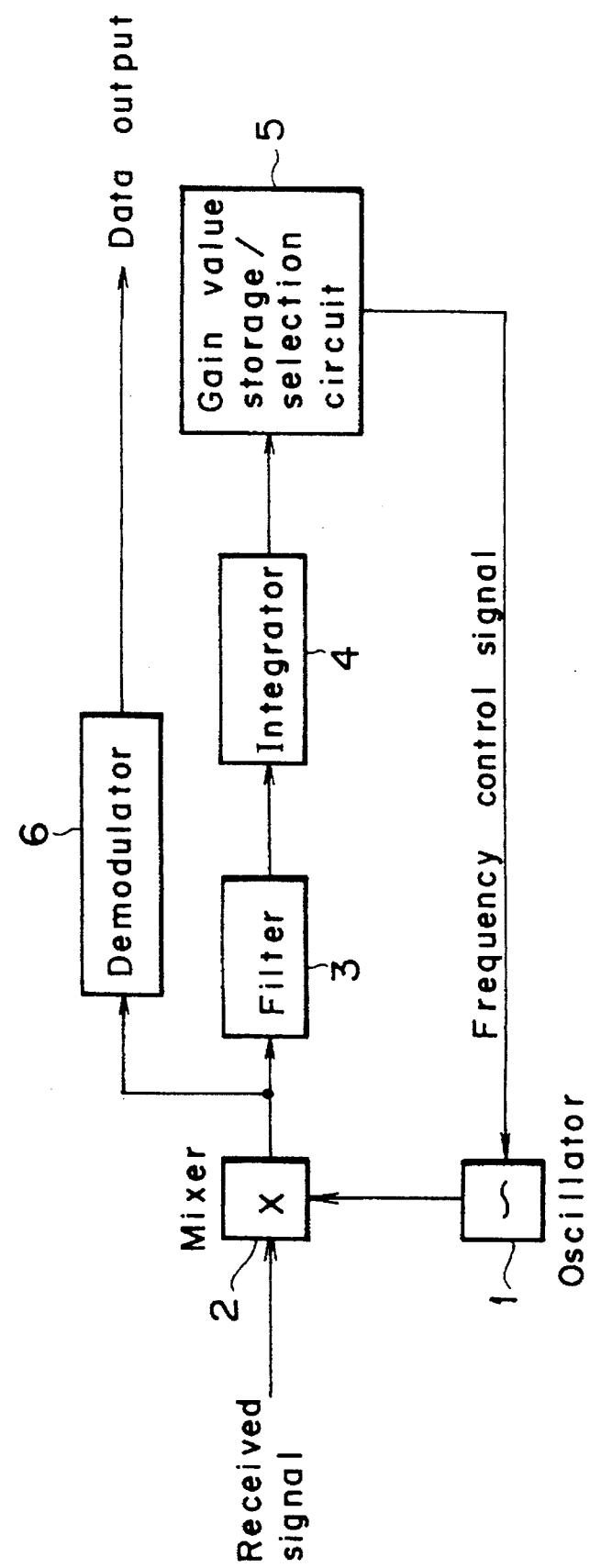
FIG. 9 is a block configurational view showing a conventional frequency-controlled circuit.

A fifth embodiment will now be described with reference to FIG. 8. In the fifth embodiment shown in FIG. 8, however, components corresponding to those employed in the fourth embodiment shown in FIG. 7 are identified by like reference numerals and their description will therefore be omitted. The fifth embodiment shown in FIG. 8 is identical in basic configuration to the fourth embodiment shown in FIG. 7. However, a received signal S1 is regarded as a four-phase phase-modulated wave and a frequency controller 61 and a demodulator 62 commonly uses a 90° hybrid circuit (90°) 69 and mixers 70 and 71.

Namely, the frequency controller 61 comprises a synthesizer 68 whose frequency of an oscillating signal S24 is varied in response to receive frequency information S23, a mixer 67 for combining a frequency of the received signal S1 and the frequency of the oscillating signal S24 into a single, composite frequency, the 90° hybrid circuit 69, the mixers 70 and 71 and a VCXO 72. In the illustrated example, the frequency of the oscillating signal S24 produced from the synthesizer 68 is assumed to be fixed to 92 MHz based on the receive frequency information S23. Further, a center frequency $f_R$ corresponding to 140 MHz, of the received signal S1 is assumed to be converted into 48 MHz by the mixer 67.

The 90° hybrid circuit 69 shifts the phase of a signal S25 outputted from the mixer 67 by 90° to separate the signal inputted thereto into I and Q channel components of the four-phase phase-modulated wave. The 90° hybrid circuit 69 outputs the I and Q channel components to their corresponding mixers 70 and 71. Further, the mixers 70 and 71 respectively combines the input signals having the I and Q channel components and an oscillating signal 26 outputted from the VCXO 72 whose frequency is varied according to a control signal S3 into signals S29 and S30 at baseband. The mixers 70 and 71 output the signals S29 and S30 therefrom respectively.

The demodulator 62 comprises the 90° hybrid circuit 69, the mixers 70 and 71, the VCXO 72, filters 73 and 74 each having a bandwidth of 250 KHz and A/D converters (A/D) 75 and 76. The A/D converters 75 and 76 respectively convert the output signals S29 and S30 of the mixers 70 and 71, which are inputted thereto through the filters 73 and 74, into digital signals and respectively output them as demodulated signals I and Q.

Further, an incoming detector 13 is composed of a UW detector 63. The incoming detector 13 detects and outputs unique words (synchronizing signals) included in the demodulated signal I corresponding to an I channel component and the demodulated signal Q corresponding to a Q channel component. A sweep/de-sweep controller 28 comprises a synchronism protector 64, a decision circuit 65 and a control voltage counter 66. When the unique words are continuously detected by a predetermined number of times by the UW detector 63, the synchronism protector 64 judges the demodulated signals I and Q as synchronized with each other and outputs the result of judgment to the decision circuit 65 of the sweep/de-sweep controller 28.

When the result of judgment indicates that they are not synchronized with each other, the decision circuit 65 divides a frequency band $f_F \pm (\Delta f_{max} + B/2)$ in which the maximum shifted width $\pm f_{max}$ of the center frequency $f_F$ of the signal S25 outputted from the mixer 67 and a bandwidth B of a signal to be received have been taken into consideration, into eight frequency slots $SR_1$ through $SR_8$. Further, the decision circuit 65 gives instructions to the control voltage counter 66 so that the VCXO 72 successively outputs center frequencies $f_{S1}$ through $f_{S8}$ of the divided frequency slots $SR_1$ through $SR_8$. At this time, the decision circuit 65 outputs a signal S12 indicative of which one of the frequency slots $SR_1$ through $SR_8$ would be specified, to a peak detector 22.

Further, when frequency slot information S10 is sent from a center-frequency decision circuit 23 in the case where the result of judgment is determined as asynchronous, the decision circuit 65 gives instructions to the control voltage counter 66 so that the VCXO 72 outputs an oscillation frequency for performing sweeping at a frequency band of a slot specified by the frequency slot information S10.

On the other hand, when the result of judgment indicates that the demodulated signals I and Q are synchronized with each other, the decision circuit 65 gives instructions to the control voltage counter 66 in such a manner that an oscillating signal S26 having the frequency which is being outputted from the VCXO 72 at present, is fixed. The control voltage counter 66 outputs the control signal S3 to the VCXO 72 in response to the instructions issued from the decision circuit 65. A filter 18 in a level detector 29 allows a signal whose frequency band ranges from 0 KHz to 250 KHz to pass therethrough.

In order to detect a power value of the slot $SR_1$ having a frequency bandwidth ranging from 46 MHz to 46.5 MHz shown in FIG. 5 under the above-described construction, the decision circuit 65 first gives instructions to the control voltage counter 66 in such a manner that a control signal S3 for controlling the oscillating signal S26 outputted from the VCXO 72 to the mixers 70 and 71 to 46.25 MHz is outputted from the control voltage counter 66.

Thus, when the signal of 46.25 MHz is outputted from the VCXO 72, each of the mixers 70 and 71 mixes the signal of 46.25 MHz and the output signal S25 of the mixer 67, which is inputted thereto through the hybrid circuit 69. If the signal S25 is now of a frequency band corresponding to the slot $SR_1$, then the signals 29 and 30 outputted from the mixers 70 and 71 respectively fall within a frequency range of 0 HHz to 250 MHz. Further, the signals S29 and S30 are outputted to a power detector 19 through the filter 18.

The power detector 19 detects a power value of a signal transmitted through the filter 18, i.e., the power value of the slot $SR_1$ of the received signal S1. Further, the power detector 19 outputs the detected power value to the peak detector 22. At this time, the peak detector 22 determines, based on the signal S12 indicative of the slot supplied thereto, to which slot the power value corresponds. As a result, the determined power value is temporarily stored in the peak detector 22 so as to correspond to the slot $SR_1$.

Similarly, the decision circuit 65 provides instructions for detecting power values of the frequency slots $SR_2$ through $SR_8$. Next, the power detector 19 detects the power values of the slots $SR_2$ through $SR_8$ and the peak detector 22 temporarily stores the detected power values therein. When the power values of all the slots $SR_1$ through $SR_8$ are stored in the peak detector 22, the peak detector 22 detects the maximum one from the power values and outputs it to the center-frequency decision circuit 23. The center-frequency decision circuit 23 outputs slot information S10 about the maximum power value outputted from the peak detector 22 to the decision circuit 65.

When, at this time, the synchronism protector 64 judges that the signal S5 indicative of the result of judgment, which is outputted from the UW detector 63, represents an asynchronized state, the sweep/de-sweep controller 28 outputs a control signal S3 for sweeping a slot corresponding to the slot information S10 outputted from the center-frequency decision circuit 23, to the VCXO 72. When the slot information S10 is assumed to be information about the slot $SR_6$ shown in FIG. 5, for example, the sweep/de-sweep controller 28 outputs a control signal S3 for sweeping a frequency band ranging from 48.5 MHz to 49 MHz in a frequency increasing direction.

The signal S5 indicative of the result of judgment, which is outputted from the UW detector 63, represents a synchronized state from the result of the above sweeping. When the signal S5 is continuously inputted to the synchronism protector 64 by a predetermined number of times, the decision circuit 65 instructs the VCXO 72 to fix the oscillation frequency thereof in response to the control signal S3. Namely, the sweep/de-sweep controller 28 instructs the frequency controller 61 to pull in the frequency of the received signal S1 at the present time.

Thus, the received signal S1 having the center frequency $f_0$=49 MHz shown in FIG. 5 is pulled in. The fifth embodiment described above can also bring about the same advantageous effect as that obtained in the fourth embodiment. According to the present invention as has been described above, the center frequency of the received signal whose frequency is shifted can be automatically detected in a short time.

Having now fully described the invention, it will be apparent to those skilled in the art that many changes and modifications can be made without departing from the spirit or scope of the invention as set forth herein.

What is claimed is:

1. A frequency-controlled circuit for automatically detecting a center frequency of a received signal by sweeping, comprising:

frequency control means including a first voltage-controlled oscillator and a first mixer, coupled to said oscillator, and receiving the received signal for mixing a frequency of the received signal and an oscillator frequency of a signal generated by said first voltage-controlled oscillator;

demodulating means, coupled to said frequency control means, for demodulating a signal outputted from said frequency control means;

incoming detecting means for receiving a demodulated signal from said demodulating means and detecting whether said demodulated signal is proper or improper to indicate whether said received signal was introduced into the circuit properly or improperly, respectively;

level detecting means received said received signal for obtaining a frequency band by adding a receive frequency band of the received signal to a center frequency of the received signal or subtracting the center frequency thereof from the receive frequency band thereof, dividing said obtained frequency band into a plurality of narrower frequency bands, and detecting respective power values of the divided frequency bands;

center-frequency determining means, coupled to said level detecting means, for detecting a maximum value from the power values detected by said level detecting means and outputting information about a divided frequency band having the detected maximum power value, said center-frequency determining means outputting information about central divided frequency bands when an odd number of divided frequency bands each having the maximum power value continuously exist, outputting information about a divided frequency band on a sweeping start side as seen in a sweeping direction of the received signal when an even number of divided frequency bands each having the maximum power value continuously exist, said divided frequency band being selected from two central divided frequency bands, and outputting information about a desired divided frequency band selected from the continuous divided frequency bands each having the maximum power value when the same maximum power values are detected within spaced-away divided frequency bands; and sweep/de-sweep control means, coupled to said incoming detecting means, Said center-frequency determining means and said frequency control means, for outputting a first frequency control signal for controlling said frequency control means to allow said frequency control means to sweep the received signal at a frequency bandwidth corresponding to the information about said desired divided frequency band, outputted from said center-frequency determining means, to said first voltage-controlled oscillator of said frequency control means when said incoming detecting means detects that said demodulated signal is improper and outputting a second frequency control signal for controlling said first voltage-controlled oscillator to fix the oscillation frequency of the signal generated by said first voltage-controlled oscillator when said incoming detecting means detects that the demodulated signal is proper.

2. A frequency-controlled circuit according to claim 1, wherein said level detecting means comprises a second voltage-controlled oscillator, a second mixer for combining the frequency of the received signal and an oscillation frequency of a signal generated by said second voltage-controlled oscillator to obtain a signal of another frequency, a filter for allowing a signal having only a predetermined frequency band outputted from said second mixer to pass therethrough, a power detecting unit for detecting a power value of the signal transmitted through said filter and outputting said power value to said center-frequency determining means, and a sweep instructing unit for controlling the oscillation frequency of said second voltage-controlled oscillator so that the signal having the divided frequency bands is outputted from said second mixer.

3. A frequency-controlled circuit according to claim 1, wherein said level detecting means comprises an oscillator, a second mixer for combining the frequency of the received signal and an oscillation frequency of a signal generated by said oscillator to obtain a signal of another frequency, a plurality of filters connected to an output of said second mixer and a plurality of power detecting units for respectively detecting power values of signals transmitted through said plurality of filters and outputting the detected power values to said center-frequency determining means.

4. A frequency-controlled circuit according to claim 1, wherein said frequency control means comprises a second mixer connected to an input of said first voltage-controlled oscillator and an oscillator for supplying an oscillating signal to said second mixer for allowing said second mixer to combine the frequency of the received signal with the frequency of the supplied oscillating signal to obtain a signal of another frequency and said level detecting means comprises a plurality of filters connected to an output of said second mixer, and a plurality of power detecting units for respectively detecting power values of signals transmitted through said plurality of filters and outputting the detected power values to said center-frequency determining means.

5. A frequency-controlled circuit for automatically detecting a center frequency of a received signal by sweeping, comprising:

frequency control means including a voltage-controlled oscillator and a plurality of mixers, one of said mixers receiving said received signal for mixing a frequency of the received signal and an oscillation frequency of a signal generated by said voltage-controlled oscillator;

demodulating means, coupled to said frequency control means, for demodulating a signal outputted from said frequency control means;

incoming detecting means for receiving a demodulated signal from said demodulating means for detecting whether said demodulated signal is proper or improper to indicate whether said received signal was introduced into the circuit properly or improperly, respectively;

level detecting means for detecting power values of signals outputted from said mixers;

sweep/de-sweep control means for obtaining a frequency band by adding a receive frequency band of the received signal to a center frequency of the received signal or subtracting the center frequency thereof from the receive frequency band thereof and dividing said obtained frequency band into a plurality of narrower frequency bands; and center-frequency determining means, coupled to said sweep/de-sweep control means and said level detecting means, for detecting a maximum value from the power values detected by said level detecting means and outputting information about a divided frequency band having the detected maximum power value, said center-frequency determining means outputting information about central divided frequency bands therefrom when an odd number of divided frequency bands each having the maximum power value continuously exist, outputting information about a divided frequency band on a sweeping start side as seen in a sweeping direction of the received signal, said divided frequency band being selected from two central divided frequency bands, when an even number of divided frequency bands each having the maximum power value continuously exist, and outputting information about a desired divided frequency band selected from the continuous divided frequency bands each having the maximum power value when the same maximum power values are detected within spaced-away divided frequency bands;

said sweep/de-sweep control means outputting a first frequency control signal to perform control for outputting a signal having the divided frequency band from said one of said mixers, to said voltage-controlled oscillator, said sweep/de-sweep control means outputting a second frequency control signal for controlling said frequency control means to allow said frequency control means to sweep the received signal at a frequency bandwidth corresponding to the information about the divided frequency band outputted from said center-frequency determining means, to said voltage-controlled oscillator when said incoming detecting means detects that the demodulated signal is improper and outputting a third frequency control signal for controlling said voltage-controlled oscillator to fix the oscillation frequency of the signal generated by said voltage-controlled oscillator, to said voltage-controlled oscillator when said incoming detecting means detects that the demodulated signal is proper.

* * * * *